United States Patent [19]

Higuchi

[11] Patent Number: 5,407,857
[45] Date of Patent: Apr. 18, 1995

[54] METHOD FOR PRODUCING A SEMICONDUCTOR DEVICE WITH A DOPED POLYSILICON LAYER BY UPDIFFUSION

[75] Inventor: Yasuyuki Higuchi, Kyoto, Japan
[73] Assignee: Rohm Co., Ltd., Kyoto, Japan
[21] Appl. No.: 170,896
[22] Filed: Dec. 21, 1993

Related U.S. Application Data

[62] Division of Ser. No. 34,812, Mar. 19, 1993, abandoned.

[30] Foreign Application Priority Data

Mar. 30, 1992 [JP] Japan .................................. 4-74028
Mar. 31, 1992 [JP] Japan .................................. 4-77081

[51] Int. Cl.$^6$ ............................................. H01L 21/22
[52] U.S. Cl. ..................................... 437/76; 437/156; 437/193
[58] Field of Search ................. 437/31, 76, 79, 149, 437/156, 161, 193, 194

[56] References Cited

U.S. PATENT DOCUMENTS

| | | | |
|---|---|---|---|
| 3,443,175 | 5/1969 | Czorny et al. | 257/588 |
| 4,259,680 | 3/1981 | Lepselter et al. | 257/588 |
| 4,280,854 | 7/1981 | Shibata et al. | 437/31 |
| 4,648,175 | 3/1987 | Metz, Jr. et al. | 437/193 |
| 5,017,507 | 5/1991 | Miyazawa | 437/193 |

*Primary Examiner*—Brian E. Hearn
*Assistant Examiner*—Chandra Chaudhari
*Attorney, Agent, or Firm*—Nikaido, Marmelstein, Murray & Oram

[57] ABSTRACT

There is provided a semiconductor device wherein a resistor layer is interposed between a semiconductor region and a surface electrode metal so as to improve a safe operation area of the device and enhance the secondary breakdown strength thereof, and a method for producing such a semiconductor device including steps of forming a n-type semiconductor region and/or a p-type semiconductor region in a semiconductor substrate by impurity doping; forming contact holes in a protective film formed on the semiconductor substrate; forming polysilicon electrode films on the semiconductor regions exposed in the contact holes, respectively; making respective impurities of the semiconductor regions diffuse into the polysilicon electrode films by a heat treatment; and forming a surface electrode metal on the polysilicon electrode films.

1 Claim, 3 Drawing Sheets

METHOD FOR PRODUCING A SEMICONDUCTOR DEVICE WITH A DOPED POLYSILICON LAYER BY UPDIFFUSION

This is a divisional, of application Ser. No. 08/034,812 now abandoned, filed Mar. 19, 1993.

FIELD OF THE INVENTION

The present invention relates to a semiconductor device and a method for producing the same, and more particularly, semiconductor device wherein a polysilicon film is interposed between a semiconductor region and a surface electrode metal so as to control an electrical resistance in coming into contact with an electrode contact thereby broadening a safety operation area (hereinafter referred to as "SOA"), and a method for producing such a semiconductor device.

BACKGROUND OF THE INVENTION

Semiconductor device is constructed by providing n-type and/or p-type regions in a semiconductor substrate to form a semiconductor circuit and connecting a metal wiring material to the semiconductor region, or the n-type or p-type region, which is required for an electrical contact with exterior.

For instance, an explanatory cross sectional view of a npn bipolar transistor is shown in FIG. 6. In FIG. 6, an impurity such as boron is diffused into a n-type silicon semiconductor substrate 1 to form a p-type base region 2, and further another impurity such as phosphorus is diffused in a part of the base region 2 to form a n-type emitter region 3. Next, the whole surface of the semiconductor substrate 1 is covered with a protective film 4 made of, for instance, silicon dioxide wherein the contact formation regions for the base and emitter regions 2 and 3 are then exposed to form contact holes 5 and 6. Subsequently a metal wiring material such as aluminum is deposited over the whole surface of the substrate by sputtering or a like method, followed by etching to form a wiring pattern on the protective film 4. As a result, the contact holes 5 and 6 are refilled with the metal wiring material which comes into direct contact with the base and emitter regions 2 and 3, thereby forming a base electrode 7 and an emitter electrode 8. The n-type semiconductor crystal layer of the semiconductor substrate 1 operates as a collector region for which a collector electrode 9 is provided by depositing a metal material such as gold on the lower side of the substrate 1.

In an integrated circuit, for instance, if aluminum as a surface electrode metal is deposited directly on a semiconductor region, incomplete adhesion therebetween due to the difference of the materials undesirably increases the contact resistance, so as to cause degradation of device characteristics. In order to reduce the contact resistance, there is generally employed is a method wherein the semiconductor region in contact formation regions is selectively and heavily doped with an impurity.

However, in a semiconductor device such as a bipolar IC, the depth of impurity diffusion is generally small, hence the base resistance and emitter resistance are too small to operate as a buffering resistance. Accordingly, current tends to be concentrated when large amount of current is applied to the device, which raises a problem of a narrow SOA and, hence a decreased secondary breakdown strength.

If it is made to broaden the SOA of the conventional semiconductor device, the depth of impurity diffusion in the base and emitter regions 2 and 3 would need to be enlarged so as to increase the resistance thereof. This raises a problem of an increase in a diffusion time so as to increase the time for producing, hence in the production cost.

SUMMARY OF THE INVENTION

Thus, it is an object of the present invention to provide a semiconductor device of which the secondary breakdown strength is improved by interposing a polysilicon film between a semiconductor region in a region for forming an electrode and a surface electrode metal for electrode, without an increase in the production cost therefor.

When a polysilicon film is interposed between the semiconductor region and the surface electrode metal for the purpose of broadening the SOA of the device and improving the secondary breakdown strength thereof, the polysilicon film is frequently provided in both the different conductive-type regions (n-type region and p-type region), for example, a base region and an emitter region of a transistor. In such a case polysilicon films provided in those regions need to be doped with impurities of different conductive types, respectively. Accordingly, there is a need to dope one of such regions with an impurity by impurity diffusion or ion implantation while the other region is masked, and vice versa. This raises a problem of increasing the number of producing steps and, hence the production cost.

Thus, it is another object of the present invention to provide a method for producing a semiconductor device capable of improving the SOA and secondary breakdown strength of the intended semiconductor device by interposing a polysilicon film which functions as a buffering resistor between a semiconductor region and a surface electrode metal, without a substantial increase in the production cost.

According to the present invention, there is provided a semiconductor device comprising a semiconductor substrate, a semiconductor circuit formed by providing a semiconductor region of n-type conductivity or p-type conductivity in the semiconductor substrate, a surface electrode metal formed at least on the semiconductor region, and a polysilicon film interposed between the semiconductor region and the surface electrode metal through which the semiconductor region is electrically connected to the surface electrode metal.

It is preferable that the polysilicon film is doped with an impurity by diffusing the impurity contained in the semiconductor region which is in contact with the polysilicon film, into the polysilicon film so as to adjust an impurity concentration of the polysilicon film.

It is possible that the polysilicon film is doped with an impurity by ion implantation so as to adjust an impurity concentration of the polysilicon film.

According to the present invention, there is also provided a transistor comprising a semiconductor substrate functioning as a collector region, base and emitter regions formed in the semiconductor substrate, polysilicon films formed on the base and emitter regions, respectively, base and emitter electrodes formed on the base and emitter regions, respectively with the respective polysilicon films sandwiched therebetween.

In this case, it is preferable that an impurity concentration of the polysilicon film sandwiched between the base region and the base polysilicon electrode is $1 \times 10^{17}/cm^3$ to $1 \times 10^{23}/cm^3$.

Further, it is also preferable that an impurity concentration of the polysilicon sandwiched between the emitter region and the emitter polysilicon electrode is $1 \times 10^{17}/cm^3$ to $1 \times 10^{23}/cm^3$.

According to the present invention, there is further provided a method for producing a semiconductor device comprising steps of:

(a) forming a semiconductor region comprising n-type and/or p-type regions in a semiconductor substrate by doping the semiconductor substrate with n-type and/or p-type impurities;

(b) forming a protective film on whole surface of the semiconductor substrate, followed by forming a contact hole extending through the protective film down to the semiconductor region;

(c) depositing a polysilicon electrode film on the semiconductor region exposed in the contact hole;

(d) diffusing the impurity contained in the semiconductor region into the polysilicon electrode film by a heat treatment; and (e) forming a surface electrode metal on the polysilicon electrode film.

With the semiconductor device of the present invention, the polysilicon film is interposed between the semiconductor region and the surface electrode metal which need to be electrically connected to each other. Accordingly, the polysilicon film can function as a buffering resistor of which the resistance can be adjusted as desired by varying the impurity concentration thereof, without requiring for adjusting the diffusion depth of the semiconductor region such as an emitter region.

In addition, since polysilicon is the same species as single crystal silicon which is usually used for a semiconductor substrate, a contact between the polysilicon film and the semiconductor region can be completely achieved. Moreover, although single crystal silicon does not provide a satisfactory contact with a material of the surface electrode metal such as aluminum, polysilicon provides a sufficient contact therewith, hence contributing to maintenance of stable device characteristics.

In accordance with the method of the present invention, in the polysilicon electrode film, the impurity which has once been doped in the semiconductor region just under the polysilicon electrode film is diffused, or in other words, the impurity having been introduced into the semiconductor region is utilized to function as an impurity source for diffusing in the polysilicon electrode film. Accordingly, even if electrodes are formed respectively for a n-type region and a p-type region coexisting in a substrate, both the polysilicon films deposited on the respective can be diffused with the respective impurities by being subjected to a heat treatment only once. Thus, formation of polysilicon electrode films having different conductive types can be achieved by one step. Besides, the resistance of each polysilicon electrode film can be set to a desired value if only the impurity concentration of the semiconductor region and the heat treatment time are adjusted.

In addition, although it is usually difficult to make the impurity concentration of a semiconductor region leaner than $10^{18}/cm^3$, according to the present invention the impurity once introduced into the semiconductor region is partially diffused into the polysilicon film so as to decrease the impurity concentration of the semiconductor region, then the SOA of the device is improved.

DETAILED DESCRIPTION

Now, the present invention will be described in detail with reference to the drawings.

Figure 1:
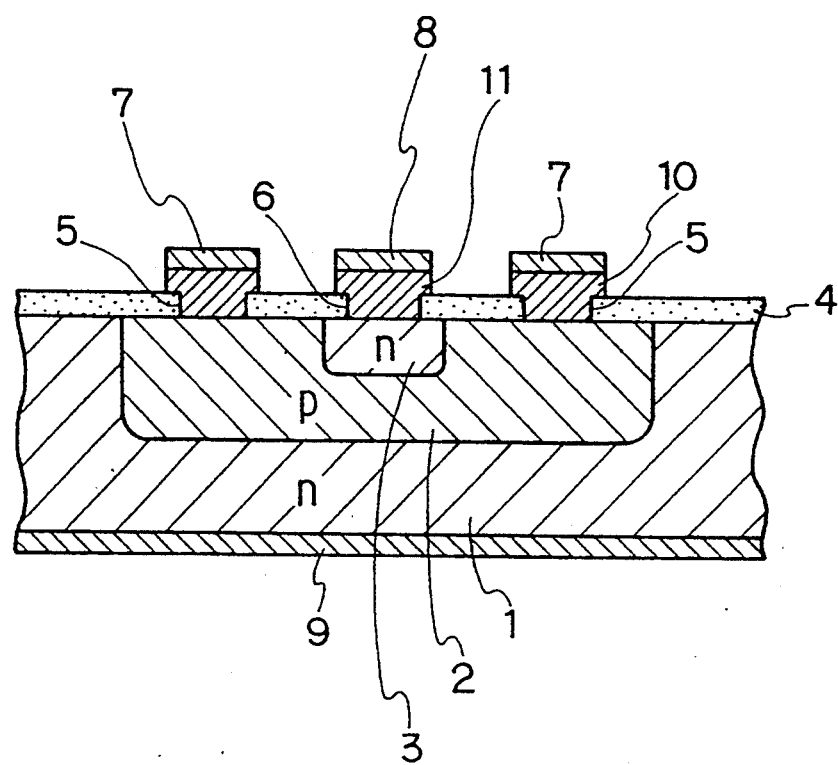
FIG. 1 is an explanatory cross sectional view showing a npn transistor portion of a semiconductor device as an embodiment of the present invention.

Referring to FIG. 1, a p-type region functioning as a base region 2 is formed in a n-type semiconductor silicon substrate 1 functioning as a collector region by diffusing thereinto an impurity such as boron. Further, a n-type region functioning as an emitter region 3 is formed by diffusing an impurity such as phosphorus into a part of the base region 2. Whole surface of the semiconductor substrate 1 is covered with a protective film 4, for example, made such as of silicon dioxide which is removed in regions for forming electrodes in the base and emitter regions 2 and 3 so as to form contact holes 5 and 6. This embodiment is characterized by interposing polysilicon films 10 and 11 between a base electrode 7 and the base region and between an emitter electrode 8 and the emitter region 3, respectively. Other structural features such as a collector electrode 9 provided on the lower side of the semiconductor substrate 1 are similar to those of a conventional semiconductor device.

These polysilicon films 10 and 11 are formed as follows:

Firstly, polysilicon is deposited over the whole substrate surface including the contact holes 5 and 6 by CVD or a like technique. Secondly, the deposited polysilicon is etched back with necessary portions thereof masked with a resist film so as to form the polysilicon films 10 and 11 in the contact holes 5 and 6, the films functioning as underlayers for respective metal film electrodes. The polysilicon film 10 is doped with a p-type impurity such as boron, while the polysilicon film 11 is doped with a n-type impurity such as phosphorus, so as to adjust the resistance of the respective film. Doping of the polysilicon films 10 and 11 can be achieved by making the impurity of the semiconductor region diffuse into the polysilicon film as will be described in detail in the description on regarding a method of the present invention or by introducing an appropriate impurity thereinto directly by ion implantation. When the impurity is doped so that the impurity concentration of the polysilicon films 10 and 11 is $2 \times 10^{18}/cm^3$, the resistance thereof is 0.02 $\Omega$. In the case of the doping by ion implantation, an impurity concentration of, for example, $2 \times 10^{18}/cm^3$ can be obtained by implanting impurity ion in a dose of $3 \times 10^{15}/cm^2$ at an acceleration energy of 70 keV, followed by annealing at about 1000° C. In an exemplary case of the doping by ion implantation, the polysilicon film 11 for the emitter electrode was implanted with phosphorus ion (P+) in a dose of $3 \times 10^{15}/cm^2$ while masking the polysilicon film 10 for the base electrode with a resist film. Subsequently the polysilicon film 10 was implanted with boron ion (B+) in the same dose as above while masking the polysilicon film 11 with a resist film. The resulting substrate was then subjected to annealing at about 1000° C. for about 30 minutes. Thus, the impurity concentration of each of the polysilicon films 10 and 11 was set to $2 \times 10^{18}/cm^3$ to $5 \times 10^{18}/cm^3$. The impurity concentration is generally used the range of $1 \times 10^{17}$ to $1 \times 10^{23}/cm^3$.

Next, a method for producing a semiconductor device will be described with reference to FIGS. 2 to 5.

Figure 2:
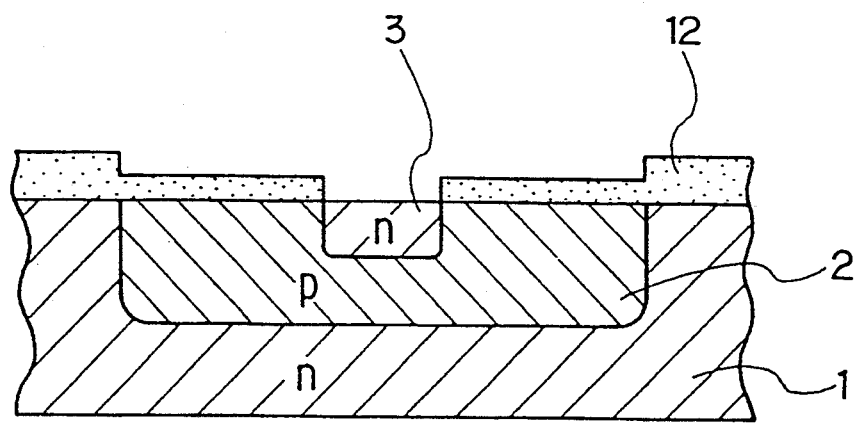
FIGS. 2 to 5 are each an explanatory cross sectional view showing a npn transistor portion of an example of a semiconductor device for illustrating producing steps embodying the present invention.

As shown in FIG. 2, first, n-type and, p-type semiconductor regions are formed in a semiconductor substrate 1. Specifically, if a transistor, for instance, is to be formed, a region for forming a base in a n-type semiconductor silicon substrate 1 functioning as a collector region is doped with an impurity such as boron to form a p-type base region 2. Subsequently a region for forming an emitter in the p-type base region 2 is doped with an impurity such as phosphorus to form an emitter region 3.

Practically, the semiconductor substrate 1 was covered with a protective film 12 made of, for instance, silicon oxide, of which a portion in the region for forming the base was then removed. Next, the substrate 1 was subjected to a heat treatment at about 1100° C. for about 120 minutes in a boron trichloride (BCl$_3$) gas atmosphere to diffuse boron in the region for forming a base thereby forming the p-type base region 2. Further, a protective film was formed to cover the base region 2, and then a portion of the protective film in the region for forming an emitter formation was removed. Subsequently the substrate 1 was subjected to a heat treatment at about 1000° C. for about 40 minutes in a phosphorus oxychloride (POCl$_3$) gas atmosphere to diffuse phosphorus in the region for forming an emitter thereby forming the n-type emitter region 3.

Figure 3:
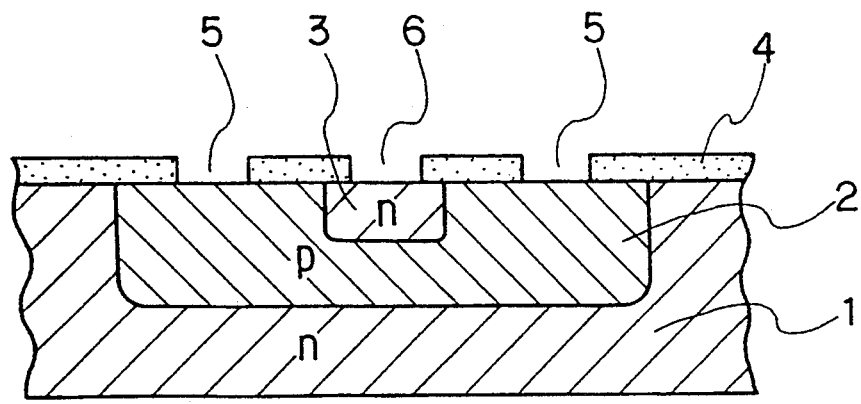

As shown in FIG. 3, next, contact holes 5 and 6 are formed in regions for forming an electrode, respectively. Practically, the surface of the substrate 1 was covered again with a protective film 4 made of, for instance, silicon oxide, which was then etched by a photolithography process using a photoresist mask to form the contact holes 5 and 6.

Figure 4:
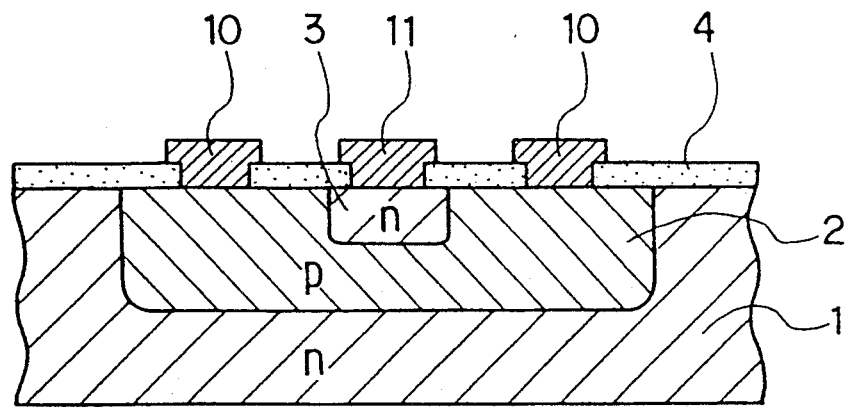

As shown in FIG. 4, in turn, a polysilicon film is deposited on the whole substrate surface, then patterned to form polysilicon electrode films 10 and 11. Practically, a polysilicon film was deposited to about 1 μm thick on the whole surface of the substrate 1 by subjecting out a heat treatment at about 700° C. for about 30 minutes in a mixed gas atmosphere of monosilane (SiH$_4$) and nitrogen. This polysilicon film was patterned by etching with regions for forming an electrode masked with a photoresist film so as to retain the polysilicon film only in those regions. Thus, the polysilicon electrode films 10 and 11 were formed.

Figure 5:
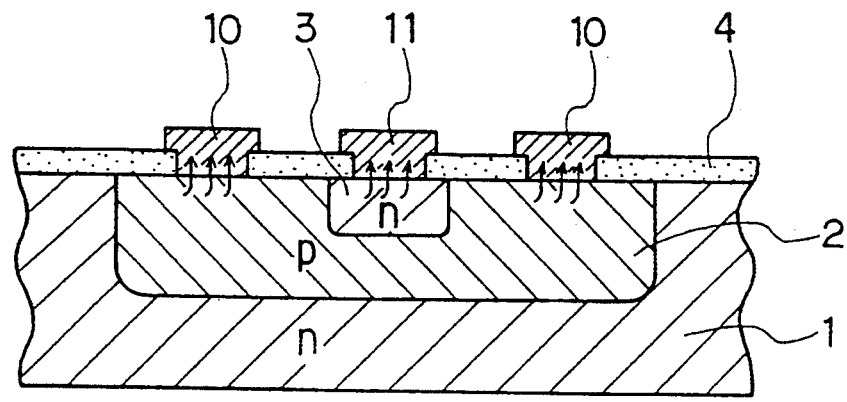
Figure 6:
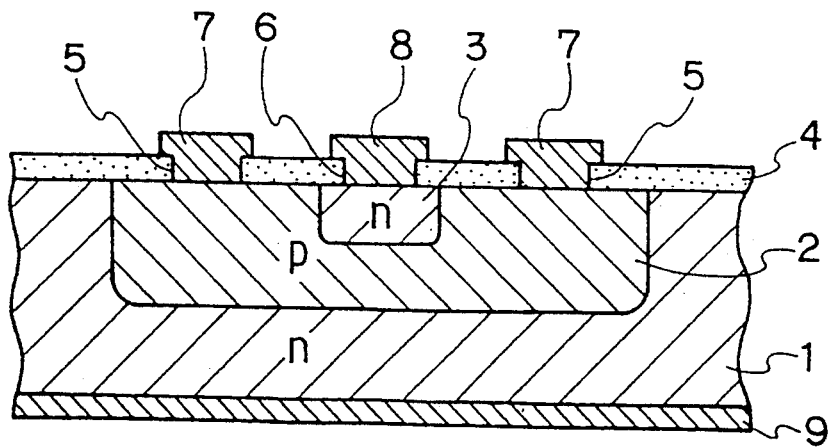
FIG. 6 is an explanatory cross sectional view showing a npn transistor portion of a conventional semiconductor device.

As shown in FIG. 5, the resulting substrate 1 is subjected to a heat treatment to diffuse the impurities from the semiconductor regions under the polysilicon films 10 and 11. Practically, a heat treatment for the substrate 1 at about 1000° C. for about 30 minutes allowed the impurities, or boron and phosphorus to diffuse from the base region 2 to the polysilicon film 10 and from the emitter region 3 to the polysilicon film 11, respectively. As a result, the polysilicon film 10 was diffused with the p-type impurity such as boron so that concentration was about $10^{18}/cm^3$ and a resistivity was about 0.1 Ω·cm, while the polysilicon film 11 was diffused with the n-type impurity such as phosphorus so that concentration was about $10^{20}/cm^3$ and a resistivity was about $10^{-3}$ Ω·cm.

Finally, a surface electrode metal is formed on the polysilicon films 10 and 11. Practically, aluminum was deposited on the whole substrate surface by sputtering and patterned by etching while masking necessary portions thereof, so as to form a base electrode 7 and an emitter electrode 8. Similarly, an aluminum film was deposited on the lower side of the semiconductor substrate 1 to form a collector electrode 9.

In diffusing the impurity from the semiconductor region to the polysilicon electrode film as above, the impurity concentration of the polysilicon film can be controlled so as to control the resistance thereof by adjusting the impurity concentration of the semiconductor region, and the temperature and time of the heat treatment for diffusion. Specifically, a 1 μm thick p-type polysilicon film having a resistivity of about 0.1 Ω·cm can be obtained by setting the impurity concentration of the semiconductor region to about $5 \times 10^{18}/cm^3$ and carrying out a heat treatment at about 1000° C. for about 30 minutes.

Although a npn transistor is formed in the above example, the same effect is taken in a pnp transistor. Further, although polysilicon electrode films are formed for the emitter and base electrodes, respectively in the above example, it would be effective if a polysilicon electrode film is formed for either the emitter electrode or the base electrode. In addition, the present invention can be applied to a diode or some electrodes in a semiconductor integrated circuit as well as to a transistor.

As has been described, according to the present invention a polysilicon film is interposed between a semiconductor region and a surface electrode metal and its resistance can be controlled by adjusting the impurity concentration thereof. Hence, there can be obtained a semiconductor with high performance device having a broad SOA and a high secondary breakdown strength because of the polysilicon film functioning as a buffering resistor, with a decreased number of producing steps without forming a deeper diffusion layer.

Further, according to the present invention the polysilicon film interposed between the semiconductor region and the surface electrode metal can be doped with an impurity so as to adjust the resistance thereof by diffusing the impurity from the semiconductor region to the polysilicon film. Accordingly, a semiconductor device wherein the resistance of an electrode part is adjusted to a desired value can be produced with a decreased number of steps at a low cost.

Though several embodiments of the present invention are described above, it is to be understood that the present invention is not limited only to the above-mentioned various changes and modifications may be made in the present invention without departing from the spirit and scope thereof.

What is claimed is:

1. A method for producing a bipolar transistor, comprising the steps of:
   (a) doping a semiconductor substrate with impurities different from each other in conductivity type into different regions to form at least a base region and an emitter region in said semiconductor substrate;
   (b) forming a protective film on an entire surface of said semiconductor substrate, followed by forming a contact hole extending downward through said protective film to each of said base and emitter regions;

(c) depositing a polysilicon electrode film on a surface of each of said base and emitter regions, said surface being exposed in said contact hole;

(d) diffusing said different impurities contained in said base and emitter regions into each respective said polysilicon electrode film; and (e) forming a surface electrode metal on each said polysilicon electrode film.

* * * * *